United States Patent
Senzaki et al.

(10) Patent No.: US 8,288,078 B2
(45) Date of Patent: *Oct. 16, 2012

(54) PHOTOSENSITIVE RESIN COMPOSITION, AND PATTERN FORMATION METHOD USING THE SAME

(75) Inventors: Takahiro Senzaki, Kanagawa (JP); Koichi Misumi, Kanagawa (JP); Atsushi Yamanouchi, Kanagawa (JP); Koji Saito, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 505 days.

This patent is subject to a terminal disclaimer.

(21) Appl. No.: 12/449,060

(22) PCT Filed: Jan. 11, 2008

(86) PCT No.: PCT/JP2008/050234
§ 371 (c)(1),
(2), (4) Date: Jul. 22, 2009

(87) PCT Pub. No.: WO2008/090768
PCT Pub. Date: Jul. 31, 2008

(65) Prior Publication Data
US 2010/0068649 A1    Mar. 18, 2010

(30) Foreign Application Priority Data

Jan. 24, 2007 (JP) ................................ 2007-013798
Jan. 24, 2007 (JP) ................................ 2007-013799

(51) Int. Cl.
G03F 7/038 (2006.01)
G03F 7/004 (2006.01)
G03F 7/30 (2006.01)

(52) U.S. Cl. ..................... 430/280.1; 430/914; 430/921; 430/925; 430/922; 430/325; 430/330; 430/273.1; 522/15; 522/31

(58) Field of Classification Search .......................... None
See application file for complete search history.

(56) References Cited

U.S. PATENT DOCUMENTS

| 4,882,245 | A | 11/1989 | Gelorme et al. | |
|---|---|---|---|---|
| 6,391,523 | B1 | 5/2002 | Hurditch et al. | |
| 6,632,589 | B2 * | 10/2003 | Inno et al. | ..................... 430/303 |
| 6,716,568 | B1 * | 4/2004 | Minsek et al. | ............. 430/280.1 |
| 7,977,030 | B2 * | 7/2011 | Senzaki et al. | ............. 430/280.1 |
| 2005/0266335 | A1 * | 12/2005 | Johnson et al. | ............ 430/270.1 |
| 2007/0225458 | A1 * | 9/2007 | Kimura et al. | ................ 526/179 |

FOREIGN PATENT DOCUMENTS

| JP | 7-78628 | 8/1995 |
|---|---|---|
| JP | 9-268205 | 10/1997 |
| JP | 10-97068 | 4/1998 |
| JP | 2005-55865 | 3/2005 |
| JP | 2006/227544 | 8/2006 |
| WO | 2005/116038 | 12/2005 |
| WO | 2007/094396 | 8/2007 |
| WO | 2007/119391 | 10/2007 |

OTHER PUBLICATIONS

International Search Report issued Feb. 5, 2008 in the International (PCT) Application of which the present application is the U.S. National Stage. PCT/JP2008/050234.

* cited by examiner

*Primary Examiner* — Cynthia Hamilton
(74) *Attorney, Agent, or Firm* — Wenderoth, Lind & Ponack, L.L.P.

(57) ABSTRACT

A photosensitive resin composition is provided that is highly safe, provides a coating film having superior uniformity, can improve the curing density of the cured resin pattern, and is capable of forming a micro resist pattern having a large film thickness and a high aspect ratio with high sensitivity and high resolving ability. According to a photosensitive resin composition including, in addition to an onium fluorinated alkyl fluorophosphate based cation polymerization initiator having a specific structure, a specified solvent or a specified sensitizing agent as essential components, a coating film having superior uniformity, can improve the curing density of the cured resin pattern, and also is capable of forming a micro resist pattern having a large film thickness and a high aspect ratio with high sensitivity and high resolving ability.

11 Claims, No Drawings

PHOTOSENSITIVE RESIN COMPOSITION, AND PATTERN FORMATION METHOD USING THE SAME

This application is a U.S. national stage of International Application No. PCT/JP2008/050234 filed Jan. 11, 2008.

TECHNICAL FIELD

The present invention relates to a photosensitive resin composition, and a method for forming a pattern using the same, and in particular, relates to a photosensitive resin composition capable of forming a micro resist pattern having a large film thickness and a high aspect ratio with high sensitivity and high resolving ability, and a method for forming a pattern using the same.

BACKGROUND ART

In recent years, MEMS (Micro Electro Mechanical System) which has been attracting attention as a mass production system that realizes high performance and high degree of integration by integrating minute parts within a single chip utilizing a semiconductor manufacturing technology is expected for development in a variety of fields such as fields of information and telecommunications, as well as automobiles, consumer appliances, and medical and bio-related fields. Demands for downsizing in each of these fields have been increasingly growing, and exploitation of a photosensitive resin composition capable of forming a micro resist pattern having a large film thickness and a high aspect ratio has been desired.

However, conventional photosensitive resin compositions including a novolac resin and diazonaphthoquinone as a photoacid generator could not provide a profile having a high aspect ratio in the case with a large film thickness. This results from the diazonaphthoquinone type photoacid generator that exhibits high absorption of near ultra violet light used in exposure, leading to large difference in exposure intensity between the top and bottom of a thick film, whereby the resulting resin pattern has a tapered or curved profile as a consequence.

Taking into consideration such circumstances, a photosensitive resin composition containing an epoxy resin and an acid generator was proposed as a photosensitive resin composition capable of forming a micro resist pattern with a high aspect ratio. Specifically, a photosensitive resin composition including an epoxy-functional novolac resin, an acid generator such as a triarylsulfonium salt, and a diluent capable of reacting with an epoxy-reactive group is disclosed (for example, see Patent Document 1). Furthermore, a photosensitive resin composition including a polyfunctional bisphenol A formaldehyde-novolac resin, triphenylsulfonium hexafluoroantimonate as an acid generator, and a cyclopentanone solvent, and capable of forming a thick film is disclosed (for example, see Patent Document 2).

On the other hand, photosensitive resin compositions that provide high sensitivity and high resolving ability were proposed in addition to the diazonaphthoquinone type photoacid generator. For example, a photosensitive resin composition prepared using an aromatic sulfonium cation polymerization initiator is disclosed (see Patent Documents 3 and 4). Moreover, a permanent film resist composition containing a cation polymerization initiator that absorbs exposure light of a wavelength of 360 nm or longer is disclosed (see Patent Document 5).

The aforementioned photocation polymerization initiator is generally constituted with a cation component and an anion component. Examples of the anion component include $SbF_6^-, AsF_6^-, PF_6^-, BF_4^-$ and the like, and known order of the sensitivity is represented by $SbF_6^- > AsF_6^- > PF_6^- > BF_4^-$. Thus, antimony (Sb) based, or arsenic (As) based cation polymerization initiators that are highly sensitive have been widely used.

However, since antimony is a deleterious substance, and arsenic is a toxic substance, to use these compounds is not preferred in light of safety aspects. Accordingly, as the cation polymerization initiator including neither antimony nor arsenic, onium fluorinated alkyl fluorophosphates are disclosed (see Patent Document 6).

Patent Document 1: Japanese Examined Patent Application Publication No. H07-78628
Patent Document 2: U.S. Pat. No. 6,391,523
Patent Document 3: Japanese Unexamined Patent Application Publication No. H09-268205
Patent Document 4: Japanese Unexamined Patent Application Publication No. 2005-055865
Patent Document 5: Japanese Unexamined Patent Application Publication No. H10-097068
Patent Document 6: International Publication No. 2005/116038

DISCLOSURE OF THE INVENTION

Problems to be Solved by the Invention

However, by merely blending the aforementioned onium fluorinated alkyl fluorophosphates in a photosensitive resin composition, although improvement of the sensitivity may be expected to some extent, favorable pattern configuration cannot be obtained. Therefore, when the onium fluorinated alkyl fluorophosphate is blended in a photosensitive resin composition, additional improvement of the sensitivity, securement of favorable pattern configuration, and improvement of uniformity of the coating film and the curing density of the cured resin pattern have been required. In addition, there exists a need for development of a photosensitive resin composition having these characteristic and capable of forming a micro resist pattern having a large film thickness and a high aspect ratio with high sensitivity and high resolving ability.

The present invention has been made in view of the problems described above; and it is an object of the present invention to provide a photosensitive resin composition that is highly safe, provides a coating film having superior uniformity, can improve the curing density of the cured resin pattern, and is capable of forming a micro resist pattern having a large film thickness and a high aspect ratio with high sensitivity and high resolving ability.

Means for Solving the Problems

The present inventors have thoroughly researched, and have consequently found that the above described problems can be solved by including in photosensitive resin compositions a lactone based solvent and a hydroxycarboxylic acid based solvent or a sensitizing agent having a dihydroxynaphthalene structure, in addition to a cation polymerization initiator having a certain specific structure and have accomplished the present invention.

More specifically, in a first aspect of the present invention a photosensitive resin composition is provided including: a polyfunctional epoxy resin as component (a); a cation polymerization initiator as component (b); and a solvent as component (c), in which the component (b) is an onium fluorinated alkyl fluorophosphates represented by the following general formula (1):

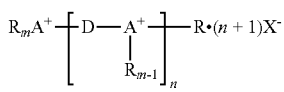

(in the formula (1), A represents a sulfur atom or an iodine atom of valence m, m being 1 or 2;

n represents the number of repeating units of the structure in parenthesis, and is an integer of 0 to 3;

R, which is an organic group bonding to A, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom;

the number of R is m+n (m−1)+1; and R may be identical or different to each other;

two or more R may bond directly or via —O—, —S—, —SO—, —SO$_2$—, —NH—, —NR'—, —CO—, —COO—, —CONH—, an alkylene group having 1 to 3 carbon atoms, or a phenylene group to form a ring structure containing A;

R' is an alkyl group having 1 to 5 carbon atoms or an aryl group having 6 to 10 carbon atoms;

D is a structure represented by the following general formula (2):

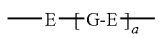

in the formula (2), E represents an alkylene group having 1 to 8 carbon atoms, an arylene group having 6 to 20 carbon atoms, or a divalent group of a heterocyclic compound having 8 to 20 carbon atoms, and E may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group, and a halogen atom;

G represents —O—, —S—, —SO—, —SO$_2$—, —NH—, —NR'—, —CO—, —COO—, —CONH—, an alkylene group having 1 to 3 carbon atoms, or a phenylene group;

a is an integer of 0 to 5;

E present in the number of "a+1" may be identical or different to each other; and G present in the number of "a" may be identical or different to each other;

R' is as defined above;

X$^-$ is a counter ion of an onium;

the number of X$^-$ is n+1 per molecule, and at least one thereof may be an anion of fluorinated alkyl fluorophosphate represented by the following general formula (3), and the remaining may be other anions;

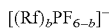

in the formula (3), Rf represents an alkyl group in which at least 80% of hydrogen atoms are each substituted with a fluorine atom;

b represents the number of Rf, and is an integer of 1 to 5; and

Rf present in the number of "b" may be identical or different to each other);

the component (c) is a mixed solvent of a lactone based solvent and a hydroxycarboxylate ester based solvent.

In a second aspect of the present invention, a photosensitive resin composition is provided including: a polyfunctional epoxy resin as component (a); a cation polymerization initiator as component (b); and a sensitizing agent as component (d), wherein the component (b) is an onium fluorinated alkyl fluorophosphate represented by the following general formula (1):

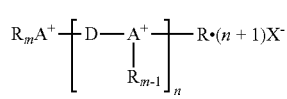

(in the formula (1), A represents a sulfur atom or an iodine atom of valence m, m being 1 or 2;

n represents the number of repeating units of the structure in parenthesis, and is an integer of 0 to 3;

R, which is an organic group bonding to A, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom;

the number of R is m+n (m−1)+1; and R may be identical or different to each other;

two or more R may bond directly or via —O—, —S—, —SO—, —SO$_2$—, —NH—, —NR'—, —CO—, —COO—, —CONH—, an alkylene group having 1 to 3 carbon atoms, or a phenylene group to form a ring structure containing A;

R' is an alkyl group having 1 to 5 carbon atoms or an aryl group having 6 to 10 carbon atoms;

D is a structure represented by the following general formula (2):

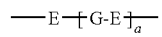

in the formula (2), E represents an alkylene group having 1 to 8 carbon atoms, an arylene group having 6 to 20 carbon atoms, or a divalent group of a heterocyclic compound having 8 to 20 carbon atoms; and E may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group, and a halogen atom;

G represents —O—, —S—, —SO—, —SO$_2$—, —NH—, —NR'—, —CO—, —COO—, —CONH—, an alkylene group having 1 to 3 carbon atoms, or a phenylene group;

a is an integer of 0 to 5;

E present in the number of "a+1" may be identical or different to each other; and G present in the number of "a" may be identical or different to each other;

R' is as defined above;

$X^-$ is a counter ion of an onium; the number of $X^-$ is n+1 per molecule, and at least one thereof may be an anion of fluorinated alkyl fluorophosphate represented by the following general formula (3), and the remaining may be an other anion;

$$[(Rf)_b PF_{6-b}]^- \quad (3)$$

in the formula (3), Rf represents an alkyl group in which at least 80% of hydrogen atoms are each substituted with a fluorine atom;

b represents the number of Rf, and is an integer of 1 to 5; and

Rf present in the number of "b" may be identical or different to each other);

and the component (d) is at least one selected from the group consisting of 2,3-dihydroxynaphthalene, 1,5-dihydroxynaphthalene, and 2,6-dihydroxynaphthalene.

Effects of the Invention

According to the present invention, a photosensitive resin composition that is highly safe, and is capable of forming a micro resist pattern having a large film thickness and a high aspect ratio with high sensitivity and high resolving ability can be provided.

PREFERRED MODE FOR CARRYING OUT THE INVENTION

Hereinafter, embodiments of the present invention will be explained in detail.

The photosensitive resin composition according to the present invention includes as an essential components in addition to the polyfunctional epoxy resin (a) and the cation polymerization initiator (b) as described later, a mixed solvent of a lactone based solvent and a hydroxycarboxylate ester based solvent as a solvent (c), or at least one selected from the group consisting of 2,3-dihydroxynaphthalene, 1,5-dihydroxynaphthalene, and 2,6-dihydroxynaphthalene as a sensitizing agent (d).

Polyfunctional Epoxy Resin (a)

The polyfunctional epoxy resin (a) which may be used in the photosensitive resin composition according to the present invention is not particularly limited as long as the epoxy resin has sufficient epoxy groups per molecule so as to form a pattern of a thick film. Examples of such polyfunctional epoxy resins include polyfunctional phenol•novolac type epoxy resins, polyfunctional orthocresol novolac type epoxy resins, polyfunctional triphenyl type novolac type epoxy resins, polyfunctional bisphenol A novolac type epoxy resins, and the like. Among these, polyfunctional bisphenol A novolac type epoxy resins are preferably used. Preferably, the functionality is at least five, and commercially available examples thereof are "Epicoat 157S70" manufactured by Japan Epoxy Resins Co., Ltd., and "Epichron N-865" manufactured by Dainippon Ink And Chemicals, Incorporated, which are preferably used in particular.

The polyfunctional bisphenol A novolac type epoxy resins described above are represented by the following general formula (5).

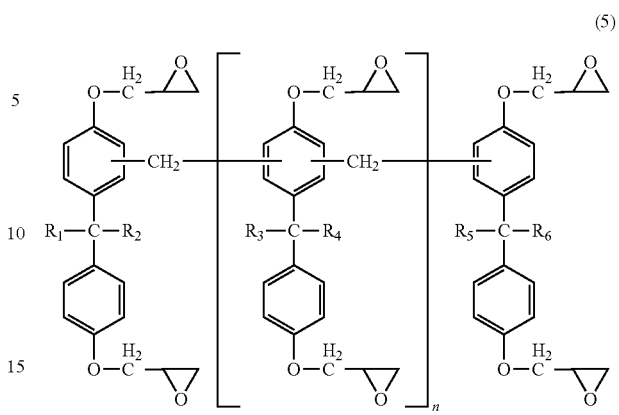

The bisphenol A novolac type epoxy resin represented by the above general formula (5) may be a polymer of a bisphenol A type epoxy resin or a bisphenol A novolac type epoxy resin with a component having an epoxy group. In the formula (5), $R_1$ to $R_6$ each represent H or $CH_3$; and n is 0 or an integer.

The softening point of the polyfunctional epoxy resin is not particularly limited as long as the resin is solid at an ambient temperature, and in general, it is preferably about 50° C. to about 100° C., and more preferably about 60° C. to about 80° C.

The content of the polyfunctional epoxy resin in the photosensitive resin composition is preferably 80% by mass to 99.9% by mass, and more preferably, 92% by mass to 99.4% by mass, based on the entire solid content. Consequently, a resist film with higher sensitivity and appropriate hardness may be provided when the resin is coated on the substrate.

Cation Polymerization Initiator (b)

The cation polymerization initiator (b) which may be used in the photosensitive resin composition according to the present invention produces cations upon being irradiated with radiation such as an ultraviolet ray, far ultraviolet ray, excimer laser such as KrF and ArF, X-ray, or electron beam, and the cation component can become the polymerization initiator.

Specifically, the cation polymerization initiator (b) for use in the photosensitive resin composition according to the present invention is an onium fluorinated alkyl fluorophosphate represented by the following general formula (1):

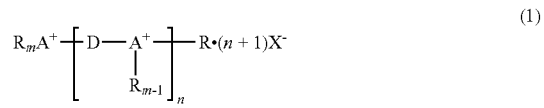

(in the formula (1), A represents a sulfur atom or an iodine atom of valence m, m being 1 or 2;

n represents the number of repeating units of the structure in parenthesis, and is an integer of 0 to 3;

R, which is an organic group bonding to A, an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one substituent selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom;

although the number of R is m+n (m−1)+1; and R may be identical or different to each other, at least one of R, more preferably all of R are the aryl group having 6 to 30 carbon atoms or the heterocyclic group having 4 to 30 carbon atoms which may have a substituent;

two or more R may bond directly or via —O—, —S—, —SO—, —SO$_2$—, —NH—, —NR'—, —CO—, —COO—, —CONH—, an alkylene group having 1 to 3 carbon atoms, or a phenylene group to form a ring structure containing A;

R' is an alkyl group having 1 to 5 carbon atoms or an aryl group having 6 to 10 carbon atoms;

D is a structure represented by the following general formula (2):

(2)

in the formula (2), E represents an alkylene group having 1 to 8 carbon atoms, arylene group having 6 to 20 carbon atoms, or divalent group of a heterocyclic compound having 8 to 20 carbon atoms; and E may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group, and a halogen atom; the term "divalent group of a heterocyclic compound" herein referred to means a divalent group derived from a heterocyclic compound by removal of each one hydrogen atom from two different ring carbon atoms;

G represents —O—, —S—, —SO—, —SO$_2$—, —NH—, —NR'—, —CO—, —COO—, —CONH—, an alkylene group having 1 to 3 carbon atoms, or a phenylene group;

a is an integer of 0 to 5;

E present in the number of "a+1" may be identical or different to each other; and G present in the number of "a" may be identical or different to each other;

R' is as defined above;

X$^-$ is a counter ion of an onium; the number of X$^-$ is n+1 per molecule, and at least one thereof may be an anion of fluorinated alkyl fluorophosphate represented by the following general formula (3), and the remaining may be an other anion;

$$[(Rf)_b PF_{6-b}]^-$$ (3)

in the formula (3), Rf represents an alkyl group in which at least 80% of hydrogen atoms are each substituted with a fluorine atom;

b represents the number of Rf, and is an integer of 1 to 5; and

Rf present in the number of "b" may be identical or different to each other).

Specific examples of preferable onium ion in the above general formula include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 4-(4-benzoylphenylthio)phenyldiphenylsulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-ylsulfonium, 2-[(diphenyl)sulfonio] thioxanthone, 4-[4-(4-tert-butylbenzoyl)phenylthio] phenyldi-p-tolylsulfonium, 4-(4-benzoylphenylthio) phenyldiphenylsulfonium, diphenylphenacylsulfonium, 4-hydroxyphenylmethylbenzylsulfonium, 2-naphthylmethyl (1-ethoxycarbonyl)ethylsulfonium, 4-hydroxyphenylmethylphenacylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

The anion component that constitutes the cation polymerization initiator which may be used in the present invention has at least one anion of fluorinated alkyl fluorophosphoric acid represented by the above general formula (3). In other words, the remaining anion component may be an other anion. The other anion, not limited specifically, may be a conventional anion. Examples thereof include halogen ions such as F$^-$, Cl$^-$, Br$^-$ and I$^-$; OH$^-$; ClO$_4^-$; sulfonate ions such as FSO$_3^-$, ClSO$_3^-$, CH$_3$SO$_3^-$, C$_6$H$_5$SO$_3^-$ and CF$_3$SO$_3^-$; sulfate ions such as HSO$_4^-$ and SO$_4^{2-}$; carbonate ions such as HCO$_3^-$ and CO$_3^{2-}$; phosphate ions such as H$_2$PO$_4^-$, HPO$_4^{2-}$ and PO$_4^{3-}$; fluorophosphate ions such as PF$_6^-$ and PF$_5$OH$^-$; borate ions such as BF$_4^-$, B(C$_6$F$_5$)$_4^-$ and B(C$_6$H$_4$CF$_3$)$_4^-$; AlCl$_4^-$; BiF$_6^-$ and the like. Other examples include fluoroantimonate ions such as SbF$_6^-$ and SbF$_5$OH$^-$, as well as fluoroarsenate ions such as A$_s$F$_6^-$ and AsF$_5$OH$^-$, but these are not preferred since a toxic element is included.

In regards to the anions of fluorinated alkyl fluorophosphoric acid represented by the general formula (3), Rf represents an alkyl group substituted with fluorine atoms, preferably having a carbon number of 1 to 8, and more preferably a carbon number of 1 to 4. Specific examples of the alkyl group include linear alkyl groups such as of methyl, ethyl, propyl, butyl, pentyl and octyl; branched alkyl groups such as of isopropyl, isobutyl, sec-butyl and tert-butyl; And cycloalkyl groups such as of cyclopropyl, cyclobutyl, cyclopentyl and cyclohexyl; the rate of hydrogen atoms in alkyl groups substituted with fluorine atoms is usually at least 80%, preferably at least 90%, and more preferably 100%. When the substitution rate with fluorine atoms is below 80%, the ability of initiating cation polymerization of the onium fluorinated alkyl fluorophosphates represented by the above general formula (1) tends to be low.

Particularly preferable Rf is a linear or branched perfluoroalkyl group having 1 to 4 carbon atoms and having a substitution rate of hydrogen atoms with fluorine atoms of 100%. Specific examples of Rf include CF$_3$, CF$_3$CF$_2$, (CF$_3$)$_2$CF, CF$_3$CF$_2$CF$_2$, CF$_3$CF$_2$CF$_2$CF$_2$, (CF$_3$)$_2$CFCF$_2$, CF$_3$CF$_2$(CF$_3$)CF, and (CF$_3$)$_3$C. The number b of Rf is an integer of 1 to 5, preferably 2 to 4, and particularly preferably 2 or 3.

Specific examples of preferable anion of fluorinated alkyl fluorophosphoric acid include [(CF$_3$CF$_2$)$_2$PF$_4$]$^-$, [(CF$_3$CF$_2$)$_3$ PF$_3$]$^-$, [((CF$_3$)$_2$CF$_2$)$_2$PF$_4$]$^-$, [((CF$_3$)$_2$CF)$_3$ PF$_3$]$^-$, [(CF$_3$CF$_2$CF$_2$)$_2$ PF$_4$]$^-$, [(CF$_3$CF$_2$CF$_2$)$_3$ PF$_3$]$^-$, [((CF$_3$)$_2$ CFCF$_2$)$_2$ PF$_4$]$^-$, [((CF$_3$)$_2$CFCF$_2$)$_3$PF$_3$]$^-$, [(CF$_3$CF$_2$CF$_2$CF$_2$)$_2$ PF$_4$]$^-$, and [(CF$_3$CF$_2$CF$_2$)$_3$ PF$_3$]$^-$. Of these, [(CF$_3$CF$_2$)$_3$ PF$_3$]$^-$, [(CF$_3$CF$_2$CF$_2$)$_3$ PF$_3$]$^-$, [((CF$_3$)$_2$CF)$_3$ PF$_3$]$^-$, [((CF$_3$)$_2$ CF)$_2$ PF$_4$]$^-$, [((CF$_3$)$_2$CFCF$_2$)$_3$ PF$_3$]$^-$, and [((CF$_3$)$_2$CFCF$_2$)$_2$ PF$_4$]$^-$ is particularly preferable.

Among the onium fluorinated alkyl fluorophosphates represented by the above general formula (1), diphenyl[4-(phenylthio)phenyl]sulfonium trifluorotrisfluoroalkylphosphate represented by the following general formula (4) is particularly preferably used.

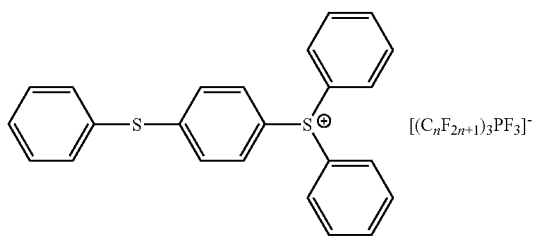

(4)

(in the formula (4), n is an integer of 1 to 10 and more preferably an integer of 1 to 5.)

In the photosensitive resin composition according to the present invention, the onium fluorinated alkyl fluorophosphate represented by the above general formula (1) may be used alone, or two or more thereof may be used in combination. Moreover, use in combination with an other conventionally known cation polymerization initiator is also acceptable. The ratio thereof when used in combination of two or more is not particularly limited, and may be determined appropriately. When such other cation polymerization initiator is used in combination, the usage ratio may be also determined arbitrarily. However, in general, the other cation polymerization initiator is included in an amount of 10 to 900 parts by mass, and preferably 25 to 400 parts by mass with respect to 100 parts by mass of the onium fluorinated alkyl fluorophosphates represented by the above general formula (1).

The content of the cation polymerization initiator (b) is preferably 0.5 to 20 parts by mass with respect to 100 parts by mass of the above polyfunctional epoxy resin (a). When the content of the cation polymerization initiator (b) is less than 0.5 parts by mass, sufficient sensitivity cannot be achieved. In contrast, when the content thereof is more than 20 parts by mass, permanent film characteristics may deteriorate. Specifically, water absorptivity, thermal decomposition temperature characteristics may deteriorate.

With a conventional phosphorus based ($PF_6^-$) or boron based ($BF_4^-$) cation polymerization initiator, an exposure dose of no less than 10 times greater than that with an antimony-based ($SbF_6^-$) polymerization initiator is required in order to attain equivalent permanent film characteristics to highly sensitive antimony based ($SbF_6^-$) cation polymerization initiator. To the contrary, the cation polymerization initiator represented by the above general formulae (1) to (3) can form a permanent film resist pattern with an equivalent sensitivity to antimony based polymerization initiators. In addition, the cation polymerization initiator represented by the above general formula (1) to (3) exhibits high safety in human bodies since it does not contain a toxic element such as antimony or arsenic. Furthermore, such a cation polymerization initiator is superior in the solubility in photosensitive resin compositions, and favorable storage stability is achieved.

Solvent (c)

The solvent (c) for use in the photosensitive resin composition according to the present invention is a mixed solvent of a lactone based solvent and a hydroxycarboxylate ester based solvent. However, the solvent (c) may also contain an other conventionally known solvent, in addition to the mixed solvent of a lactone based solvent and a hydroxycarboxylate ester based solvent.

Lactone Based Solvent

The lactone based solvent has a property to be incorporated in the resist pattern as a consequence of ring-opening of the lactone by the heating treatment in formation, thereby leading to a reaction with a functional group in the polymer. Thus, use of the lactone based solvent is preferred since it may contribute to improvement of the curing density of cured resin patterns, and can reduce the volatile matter weight, whereby a favorable working environment can be provided. Specific examples of the lactone based solvent include γ-butyrolactone, β-propiolactone, γ-valerolactone, δ-valerolactone, γ-caprolactone, and ε-caprolactone.

Hydroxycarboxylate Ester Based Solvent

The hydroxycarboxylate ester based solvent has properties to improve the coatability and levelling properties. Therefore, use in combination with the hydroxycarboxylate ester based solvent enables a smooth and uniform resist film to be formed without defects such as pin holes. Specific examples of the hydroxycarboxylate ester based solvent include glycolic acid alkyl esters, lactic acid alkyl esters, and 2-hydroxybutyric acid alkyl ester among the alkyl groups having a carbon number of 1 to 5.

When at least one selected from the group consisting of 2,3-dihydroxynaphthalene, 1,5-dihydroxynaphthalene, and 2,6-dihydroxynaphthalene is included as a sensitizer (d), the solvent (c) is not limited to the mixed solvent of the lactone based solvent and the hydroxycarboxylate ester based solvent, and a conventionally known solvent may be used. Examples of such conventionally known solvent include γ-butyrolactone, propylene carbonate, propylene glycol monomethyl ether acetate, methyl isobutyl ketone, butyl acetate, methyl amyl ketone, 2-heptanone, ethyl acetate, methyl ethyl ketone, and the like. Among the above solvents, γ-butyrolactone and propylene carbonate are preferably used in the case of the liquid resist in terms of reacting with and being incorporated in the resist film, while propylene glycol monomethyl ether acetate, methyl isobutyl ketone, butyl acetate and methyl amyl ketone are preferably used in the case of dry films with respect to wettability with the substrate film and surface tension.

Sensitizing Agent (d)

The photosensitive resin composition according to the present invention includes a sensitizing agent having a dihydroxynaphthalene structure that includes two hydroxyl groups which are crosslinkable with the aforementioned polyfunctional epoxy resin (a), as a sensitizing agent (d). The sensitizing function of such a sensitizing agent can result in additional high sensitivity of the photosensitive resin compositions. In addition, since the sensitizing agent has two crosslinkable hydroxyl groups, crosslinking density of the polyfunctional epoxy resin can be increased to enable the film itself constituted with the photosensitive resin layer to become denser, and the photosensitive resin layer can be made harder and less water-absorbable. Furthermore, the photosensitive resin layer can be made to have a higher Tg, increased hardness and less heat-expandability due to having a plurality of aromatic rings.

Specifically, the sensitizing agent used in the present invention is any one of 2,3-dihydroxynaphthalene, 1,5-dihydroxynaphthalene, and 2,6-dihydroxynaphthalene. By using these sensitizing agents alone or in combination, further enhanced sensitivity can be achieved. The content of the sensitizing agent (d) is 1 to 50 parts by mass with respect to 100 parts by mass of the above polyfunctional epoxy resin (a). Such a composition serves to obtain a desired effect without deterioration of the resist pattern configuration.

The content of the aforementioned naphthol type sensitizing agent is 1 to 50 parts by mass with respect to 100 parts by mass of the polyfunctional epoxy resin (a). Such a composition serves to obtain a desired effect without deterioration of the resist pattern configuration.

When the mixed solvent of the lactone based solvent and the hydroxycarboxylate ester based solvent is used as the solvent (c), the sensitizing agent (d) is not limited to 2,3-dihydroxynaphthalene, 1,5-dihydroxynaphthalene and 2,6-dihydroxynaphthalene, and aromatic polycyclic compounds having at least 2 or more substituents crosslinkable with the polyfunctional epoxy resin (a) can be used. Examples of the substituent crosslinkable with the polyfunctional epoxy resin (a) include a hydroxyl group, carboxyl groups, amino groups, and the like. Of these, aromatic polycyclic formula compounds having two or more substituents of at least one kind such as a naphthalene compound, a dinaphthalene compound, an anthracene compound, and a phenanthroline compound may be preferably used. Among these, naphthalene compounds and anthracene compounds are particularly preferred.

Specific examples of the naphthalene compound and the anthracene compound include 1-naphthol, β-naphthol, α-naphtholmethyl ether, α-naphtholethyl ether, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, 9,10-dihydroxyanthracene, and the like. The content of the naphthol type sensitizing agent is 1 to 50 parts by mass with respect to 100 parts by mass of the above polyfunctional epoxy resin (a). Such a composition serves to obtain a desired effect without deterioration of the resist pattern configuration.

As described above, in an attempt to provide a photosensitive resin composition capable of forming a micro resist pattern having a large film thickness and a high aspect ratio, and which is capable of producing a coating film having superior uniformity to provide a cured resin pattern having superior curing density, also with high sensitivity and high resolving ability, the present invention can provide a photosensitive resin composition with still higher sensitivity and higher resolving ability by using onium fluorinated alkyl fluorophosphate represented by the above general formulae (1) to (3) as a cation polymerization initiator with an equivalent sensitivity to highly sensitive antimony based ($SbF_6^-$) polymerization initiator, and by further using in combination with a lactone based solvent that is superior in improving the curing density of the cured resin pattern, and a hydroxycarboxylate ester based solvent capable of imparting favorable coatability and levelling properties, and/or using in combination with the aforementioned sensitizing agent.

Linear Polymer Bifunctional Epoxy Resin (e)

A linear polymer bifunctional epoxy resin (e) may be contained in the photosensitive resin composition according to the present invention for improving the film forming property. Specifically, a polymer of bisphenol A type epoxy or bisphenol F type epoxy may be exemplified, and the average molecular weight of the same is preferably 2,000 to 7,000, and more preferably 3,000 to 5,000. When the average molecular weight is less than 2,000, the film forming property cannot be improved, while an average molecular weight exceeding 7,000 may lead to incompatibility with the polyfunctional epoxy resin (a). For example, "Epicoat 1009" (average molecular weight: 3,750) manufactured by Japan Epoxy Resins Co., Ltd. is preferably used.

Other Components

The photosensitive resin composition according to the present invention may contain an oxetane derivative and an epoxy derivative from the standpoint of improving flexibility of the photosensitive resin composition before curing without deteriorating the properties of the photosensitive resin after curing. Furthermore, conventionally known agents of miscible additives such as, for example, additional resins, plasticizers, stabilizers, colorants, surfactants, coupling agents and the like for improving patterning efficiency, can be appropriately contained if desired. For example, with respect to 100 parts by mass of the above polyfunctional epoxy resin (a), 0.5 to 30 parts by mass of an epoxy silane coupling agent, and 0.01 to 0.1 parts by mass of a levelling agent may be included.

In the mode of using the photosensitive resin composition according to the present invention, the composition may be applied on a support, or a dry film obtained by protecting each side of a layer formed from the photosensitive resin composition with protective films may be adhered on a support. When provided in the form of a dry film, it is preferable to use any of polymeric films such as a polyethylene terephthalate film, polypropylene film and polyethylene film as the protective film. Supply in the form of a dry film enables the steps of application on a support and drying to be eliminated, whereby the formation of a pattern using the photosensitive resin composition of the present invention can be simplified.

In other words, a favorable resin pattern can be formed in a manner faithfully following the mask pattern without depending on the support employed by applying the photosensitive resin composition according to the present invention on a support such as, for example, a silicon wafer or the like with a spin coater etc., followed by drying, and subjecting to pattern exposure and a development process with a developing solution. Alternatively, a favorable resin pattern can be formed in a manner faithfully following the mask pattern also by adhering the dry film described above onto the support, and removing the protective film, followed by subjecting to a pattern exposure and a development process with a developing solution. Further, a favorable resin pattern can be formed in a manner faithfully following the mask pattern also by adhering the dry film described above onto the support, and subjecting to pattern exposure, followed by removing the protective film and carrying out a development process with a developing solution. Therefore, even in the case in which a dry film is provided on a resist pattern, and resist patterning is further required in formation of electronic devices such as for example, MEMS, favorable fine resin formation can be realized without causing distortion of the dry film.

EXAMPLES

Hereinafter, Examples of the present invention are explained; however, the present invention should not be limited to the Examples.

Examples 1 to 8, and Comparative Examples 1 to 5

According to the formulations shown in Table 1 and Table 2 (the unit based on part by mass), a polyfunctional epoxy resin, a cation polymerization initiator, a solvent, and other components were blended to obtain photosensitive resin compositions.

These photosensitive resin compositions were applied to a silicon wafer by means of a spin coater, and then dried, thereby obtaining a photosensitive resin layer having a film thickness of 30 μm. The photosensitive resin composition layer was prebaked on a hot plate at 60° C. for 5 min, and at 90° C. for 10 min. After the prebaking, pattern exposure (soft contact, ghi ray) was carried out using PLA-501F (contact aligner, manufactured by Canon Inc.), and then post-exposure baking (PEB) was carried out at 90° C. for 5 minutes using a hot plate. Then, a developing process was carried out for 8 minutes by an immersion process using PGMEA (propylene glycol monomethyl ether acetate). Next, the developed resin pattern was post-baked together with the substrate at 200° C. for 1 hour using an oven to obtain a resin pattern hardened on the substrate.

Evaluation of Pattern Width

In regards to evaluation of fine line adhesiveness on Examples 1 to 6, and Comparative Example 1, the width of the most closely-attached fine pattern was measured and evaluated for the resist pattern formed with necessary exposure dose following the development. The evaluation results are shown in Table 1 and Table 2.

Evaluation of Coating Film Uniformity

With respect to Examples 7 and 8, and Comparative Examples 2 to 4, the periphery of the edge of the photoresist having a film thickness of 30 μm obtained by spin coating as described above was cut in a width of 5 mm, and the uniformity of the coating film was determined from the average of the film thickness at nine points in the wafer face. The evaluation results are shown in Table 1 and Table 2.

Evaluation of Film Density

In addition, with respect to Examples 7 and 8, and Comparative Examples 2 to 4, the amount of degassing resulting from residual solvent in the cured resin pattern was evaluated from the temperature leading to 5% reduction in weight with TG/DTA (manufactured by Seiko Instruments Inc. (rate of temperature rise: 10° C./min, measurement atmosphere: air)), since γ-butyrolactone is incorporated into the resin by a cation polymerization reaction to decrease the residual solvent, whereby the temperature leading to reduction in weight is elevated.

TABLE 1

| | Blended component | Example 1 | 2 | 3 | 4 | 5 | 6 | 7 | 8 |
|---|---|---|---|---|---|---|---|---|---|
| Polyfunctional epoxy resin | A-1 | 100 | 100 | — | 80 | 100 | 90 | 100 | 90 |
| | A-2 | — | — | 100 | — | — | — | — | — |
| Initiator | B | 3 | 3 | 3 | 3 | 3 | 3 | 5 | 5 |
| Difunctional epoxy resin | C | — | — | — | 20 | — | — | — | — |
| Sensitizing agent | D-1 | — | 1 | 1 | 1 | 1 | 1 | — | — |
| | D-2 | 1 | — | — | — | — | — | — | — |
| | D-3 | — | — | — | — | — | — | 1 | 1 |
| Solvent | E-1 | 50 | 50 | 50 | 50 | 50 | 50 | 25 | 25 |
| | E-2 | — | — | — | — | — | — | 25 | 25 |
| Others | F | — | — | — | — | — | 10 | — | 10 |
| | G | — | — | — | — | 1 | 1 | 1 | 1 |
| Exposure dose (mJ/cm$^2$) | | 300 | 300 | 300 | 300 | 300 | 300 | — | — |
| Fine line adhesion (μm) | | 6 | 8 | 8 | 10 | 8 | 8 | — | — |
| Coating film uniformity (%) | | — | — | — | — | — | — | 2.32 | 1.87 |
| Temperature leading to 5% reduction in weight | | — | — | — | — | — | — | 314 | 310 |

TABLE 2

| | Blended component | Comparative Example 1 | 2 | 3 | 4 | 5 |
|---|---|---|---|---|---|---|
| Polyfunctional epoxy resin | A-1 | 100 | — | 80 | 100 | 100 |
| | A-2 | — | 100 | — | — | — |
| Initiator | B | 3 | 5 | 5 | 5 | 5 |
| Bifunctional epoxy resin | C | — | — | 20 | — | — |
| Sensitizing agent | D-1 | — | — | — | — | — |
| | D-2 | — | — | — | — | — |
| | D-3 | — | 1 | 1 | 1 | 1 |
| Solvent | E-1 | 50 | 50 | 50 | 50 | — |
| | E-2 | — | — | — | — | 50 |
| Others | F | — | — | — | — | — |
| | G | — | 1 | 1 | 1 | 1 |
| Exposure dose (mJ/cm$^2$) | | 300 | — | — | — | — |
| Fine line adhesion (μm) | | 20 | — | — | — | — |
| Coating film uniformity (%) | | — | 1.87 | 1.89 | 1.87 | 4.22 |
| Temperature leading to 5% reduction in weight | | — | 305 | 298 | 303 | 320 |

(A-1): Polyfunctional bisphenol A novolac type epoxy resin: JER157S70 (manufactured by Japan Epoxy Resins Co., Ltd., trade name)
(A-2): Polyfunctional bisphenol A novolac type epoxy resin: Epichron N-865 (manufactured by Dainippon Ink And Chemicals, Incorporated, trade name)
(B-1): Cation polymerization initiator: diphenyl[4-(phenylthio)phenyl]sulfonium trifluorotrispentafluoroethylphosphate
(C): Bifunctional epoxy resin: JER1004 (manufactured by Japan Epoxy Resins Co., Ltd., trade name)
(D-1): 2,3-Dihydroxynaphthalene
(D-2): 1,5-Dihydroxynaphthalene
(D-3): 1-Naphthol
(E-1): Ethyl lactate
(E-2): γ-Butyrolactone
(F): Oxetane derivative: 1,4-bis{[(3-ethyl-3-oxetanyl)methoxy]methyl}benzene
(G): Levelling agent: Paintad M (manufactured by Dow Corning Corporation, trade name)

INDUSTRIAL APPLICABILITY

As described hereinabove, the photosensitive resin composition according to the present invention provides a coating film having superior uniformity, can improve the curing density of the cured resin pattern, and is further suited for use as a photosensitive resin composition capable of forming a micro resist pattern having a large film thickness and a high aspect ratio with high sensitivity and high resolving ability. In addition, the photosensitive resin composition according to the present invention is useful in forming a micro resist pattern having a large film thickness and a high aspect ratio, and in particular, is suited for resin molding with high dimension stability in highly sensitive electronic devices etc., having minute dimensions.

The invention claimed is:

1. A photosensitive resin composition, comprising: a polyfunctional epoxy resin as component (a); a cation polymerization initiator as component (b); and a solvent as component (c), wherein the component (b) is an onium fluorinated alkyl fluorophosphate represented by the following general formula (1):

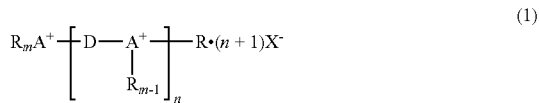
(1)

(in the formula (1), A represents a sulfur atom or an iodine atom of valence m, m being 1 or 2;

n represents the number of repeating units of the structure in parenthesis, and is an integer of 0 to 3;

R, which is an organic group bonding to A, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom;

the number of R is m+n (m−1)+1; and R may be identical or different to each other;

two or more R may bond directly or via —O—, —S—, —SO—, —SO$_2$—, —NH—, —NR'—, —CO—, —COO—, —CONH—, an alkylene group having 1 to 3 carbon atoms, or a phenylene group to form a ring structure containing A;

R' is an alkyl group having 1 to 5 carbon atoms or an aryl group having 6 to 10 carbon atoms;

D is a structure represented by the following general formula (2):

(2)

in the formula (2), E represents an alkylene group having 1 to 8 carbon atoms, an arylene group having 6 to 20 carbon atoms, or a divalent group of a heterocyclic compound having 8 to 20 carbon atoms, and E may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group, and a halogen atom;

G represents —O—, —S—, —SO—, —SO$_2$—, —NH—, —NR'—, —CO—, —COO—, —CONH—, an alkylene group having 1 to 3 carbon atoms, or a phenylene group;

a is an integer of 0 to 5;

E present in the number of "a+1" may be identical or different to each other; and G present in the number of "a" may be identical or different to each other;

R' is as defined above;

X$^-$ is a counter ion of an onium;

the number of X$^-$ is $^n$+1 per molecule, and at least one thereof is an anion of fluorinated alkyl fluorophosphate represented by the following general formula (3), and the remaining may be an other anion;

(3)

in the formula (3), Rf represents an alkyl group in which at least 80% of hydrogen atoms are each substituted with a fluorine atom;

b represents the number of Rf, and is an integer of 1 to 5; and

Rf present in the number of "b" may be identical or different to each other), and the component (c) is a mixed solvent of a lactone based solvent and a hydroxycarboxylate ester based solvent, wherein the hydroxycarboxylate ester based solvent is at least one selected from the group consisting of a glycolic acid alkyl ester, a lactic acid alkyl ester and a 2-hydroxbutyric acid alkyl ester, having an alkyl group with a carbon number of 1-5.

2. The photosensitive resin composition according to claim 1, wherein the component (c) is a mixed solvent of a γ-butyrolactone and ethyl lactate.

3. The photosensitive resin composition according to claim 1, wherein the component (b) is diphenyl[4-(phenylthio)phenyl]sulfonium trifluorotrisfluoroalkylphosphate.

4. The photosensitive resin composition according to claim 1, wherein the component (a) is a polyfunctional bisphenol A novolac type epoxy resin.

5. The photosensitive resin composition according to claim 1, wherein the component (b) is included in an amount of 0.5 parts by mass to 20 parts by mass with respect to 100 parts by mass of the component (a).

6. The photosensitive resin composition according to claim 1, further comprising: a linear polymer bifunctional epoxy resin as component (e).

7. A dry film configured by forming a protective film on each side of a layer formed from the photosensitive resin composition according to claim 1.

8. A method for producing a resist pattern, wherein a cured resin pattern of a predetermined shape is obtained by removing the protective film of the dry film according to claim 7, and adhering the dry film on a support, exposing to obtain a predetermined pattern, followed by heat-treating a resin pattern obtained by development.

9. A method for producing a resist pattern, wherein a cured resin pattern of a predetermined shape is obtained by adhering the dry film according to claim 7 on a support, exposing to obtain a predetermined pattern, followed by removing the protective film of the dry film, developing, and then heat-treating the resultant resin pattern.

10. A method for producing a resist pattern, wherein a cured resin pattern of a predetermined shape is obtained by applying a photosensitive resin composition according to claim 1 on a support, drying, and exposing to obtain a predetermined pattern, followed by heat-treating the resin pattern obtained by development.

11. A photosensitive resin composition, comprising: a polyfunctional epoxy resin as component (a); a cation polymerization initiator as component (b); and a sensitizing agent as component (d), wherein the component (a) is a bisphenol A novolac type epoxy resin represented by the following general formula (5):

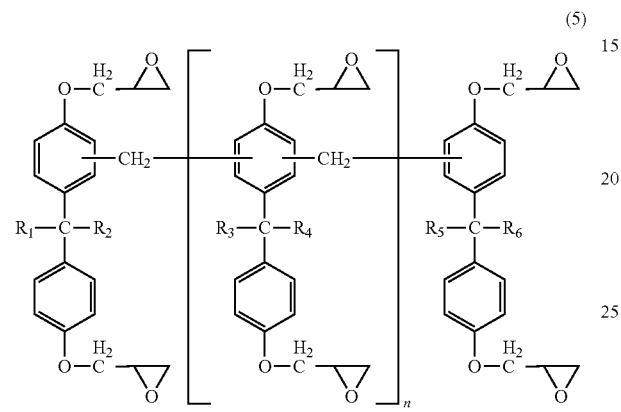

wherein $R_1$ to $R_6$ each represent H or $CH_3$, and n is an integer of 0 or greater, the component (b) is an onium fluorinated alkyl fluorophosphate represented by the following general formula (1):

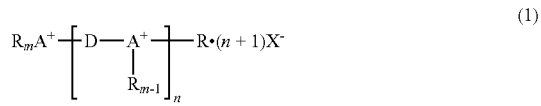

(in the formula (1), A represents a sulfur atom or an iodine atom of valence m, m being 1 or 2;

n represents the number of repeating units of the structure in parenthesis, and is an integer of 0 to 3;

R, which is an organic group bonding to A, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom;

the number of R is m+n (m−1)+1; and R may be identical or different to each other;

two or more R may bond directly or via —O—, —S—, —SO—, —SO$_2$—, —NH—, —NR'—, —CO—, —COO—, —CONH—, an alkylene group having 1 to 3 carbon atoms, or a phenylene group to form a ring structure containing A;

R' is an alkyl group having 1 to 5 carbon atoms or an aryl group having 6 to 10 carbon atoms;

D is a structure represented by the following general formula (2):

in the formula (2), E represents an alkylene group having 1 to 8 carbon atoms, an arylene group having 6 to 20 carbon atoms, or a divalent group of a heterocyclic compound having 8 to 20 carbon atoms, and E may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group, and a halogen atom;

G represents —O—, —S—, —SO—, —SO$_2$—, —NH—, —NR'—, —CO—, —COO—, —CONH—, an alkylene group having 1 to 3 carbon atoms, or a phenylene group;

a is an integer of 0 to 5;

E present in the number of "a+1" may be identical or different to each other; and G present in the number of "a" may be identical or different to each other;

R' is as defined above;

X$^-$ is a counter ion of an onium;

the number of X$^-$ is n+1 per molecule, and at least one thereof is an anion of fluorinated alkyl fluorophosphate represented by the following general formula (3), and the remaining may be an other anion;

in the formula (3), Rf represents an alkyl group in which at least 80% of hydrogen atoms are each substituted with a fluorine atom;

b represents the number of Rf, and is an integer of 1 to 5; and

Rf present in the number of "b" may be identical or different to each other), and the component (d) is at least one selected from the group consisting of 2,3-dihydroxynaphthalene, 1,5-dihydroxynaphthalene, and 2,6-dihydroxynaphthalene.

* * * * *